United States Patent [19]

Nagai et al.

[11] 4,359,372

[45] Nov. 16, 1982

[54] METHOD FOR MAKING A CARBIDE THIN FILM THERMISTOR

[75] Inventors: Takeshi Nagai; Kazushi Yamamoto; Ikuo Kobayashi, all of Nara, Japan

[73] Assignee: Matsushita Electric Industrial Company, Limited, Osaka, Japan

[21] Appl. No.: 196,011

[22] Filed: Oct. 10, 1980

[30] Foreign Application Priority Data

Oct. 11, 1979 [JP] Japan .................. 54-131474
Nov. 20, 1979 [JP] Japan .................. 54-151031
Jun. 23, 1980 [JP] Japan .................. 55-85553
Jun. 23, 1980 [JP] Japan .................. 55-85541

[51] Int. Cl.³ .................................... C23C 15/00
[52] U.S. Cl. .................. 204/192 F; 29/612; 29/613; 29/620; 29/621; 338/22 R; 338/22 SD
[58] Field of Search .......... 204/192 F, 192 C; 338/22 R, 225 D; 29/612, 613, 619-621

[56] References Cited

U.S. PATENT DOCUMENTS 4,001,586 1/1977 Fraioli .................. 250/345
4,200,970 5/1980 Schonberger .......... 29/593

FOREIGN PATENT DOCUMENTS 2919191 11/1979 Fed. Rep. of Germany ... 204/192 C

Primary Examiner—Aaron Weisstuch
Attorney, Agent, or Firm—Lowe, King, Price & Becker

[57] ABSTRACT

A method for making a carbide thin film thermistor which comprises providing an insulating substrate, forming at least one pair of electroconductive electrodes on the substrate in a desired pattern, and forming a carbide resistor film on the insulating substrate and the electroconductive electrodes by sputtering process while leaving part of the electrodes exposed for external connections. A carbide target material is sputtered in an inert gas atmosphere containing a small amount of an impurity gas. The thermistor element is arbitrarily controlled to have a desired level of resistance by choice of the impurity gas, the amount of such gas and the mode of sputtering. Optionally, the element is trimmed to adjust its resistance accurately and is also hermetically sealed within a glass tube to prevent the element from being contaminated with harmful substances.

25 Claims, 6 Drawing Figures

METHOD FOR MAKING A CARBIDE THIN FILM THERMISTOR

BACKGROUND OF THE INVENTION

1. Field of the Invention

This invention relates to an electric resistor having a large negative temperature coefficient of resistance, that is, an NTC thermistor (negative temperature coefficient thermistor). More particularly, it relates to a method for making a carbide thin film thermistor.

2. Description of the Prior Art

In the manufacture of known NTC thermistors, it is the general practice to use materials which are obtained by sintering mixtures of various oxides of metals such as Fe, Ni, Co, Mn and the like at high temperatures. Since the B constant of the oxides of the just-mentioned type is usually in the range of 4000°–6000° K., a thermistor made of these oxides has the advantage that the rate of variation in resistance is large as the temperature varies by unit degree but has the disadvantage in that it is not possible to detect by a single element a temperature variation over a relatively wide range, say, from room temperature to 400° C. This is attributed to the fact that thermistors using such metal oxides having a large B constant are so varied in resistance as to be outside a useful range (about 1–100KΩ) when subjected to such a wide range of temperature as mentioned above. Accordingly, when known NTC thermistors are used to control the temperature of for example cooking or combustion devices, undesirably two types of thermistors for low and high temperatures have to be employed since a necessary control range of temperature for the above purpose is usually from room temperature to 400° C. This also involves further disadvantages such as a complicated circuit arrangement, a high production cost, and a lowering in reliability.

The thermistor of the type mentioned above is ordinarily employed in an atmospheric environment under which it is very stable. In this connection, however, when the thermistor is utilized under severe conditions, such as in cooking or combustion devices, contaminated with or exposed to vapors or fine droplets of seasonings such as various sauces, soys, oils, salt solutions, water, or exhaust gases resulting from high temperature combustion, the metal oxides tend to be reduced, with the attendant variation in their characteristic properties.

Aside from sintered materials comprising mixed oxides, there are also known thermistor elements or chips which include an insulating substrate, having electrode films and a temperature sensitive resistor film formed on one surface of the substrate. Typical of the temperature sensitive resistor films are vacuum evaporated films and sputtered films such as of Ge, the afore-mentioned metal oxides, SiC, and the like. However, the resistor films of Ge or the oxide mixtures have disadvantages similar to those of the sintered materials comprising oxide mixtures. Though the SiC resistor film has excellent stability to heat and an excellent resistance-temperature characteristic suitable for detecting a wide range of temperatures, the film usually has to be formed by the sputtering method, involving several problems described below.

Sputtering techniques have been widely used to form various materials such as, for example, conductive materials, dielectric materials, and semiconductive materials into thin films for making electric parts such as resistors, capacitors and the like.

With resistors, the fundamental characteristics of the resistors depend on the type of resistive materials, and various target materials are used depending on the purpose and end use. As a matter of course, the process of making the resistor film is also an important factor which has a great influence on the electrical properties of the film, resistive properties, deposition thickness, specific resistance and the like. Among the various parameters of the sputtering technique, the most important ones are sputtering gas pressure, substrate temperature, sputtering power, sputtering time and purity of sputtering gas. The sputtering technique makes use of a phenomenon where ionized gas molecules are accelerated by an electric field and caused to collision with a target whereupon the target material is emitted in the form of atoms or molecules. In the sputtering procedure, it is conventional to use Ar gas at $10^{-1}$–$10^{-3}$ Torr. pressure having a high purity of about 99.9999%. The substrate is heated and held at a suitable temperature to ensure a good adherence to the deposited film. Choice of the temperature is made in consideration of the temperature necessary for removing water or organic matter from the surface of the substrate (e.g. above 100° C.), the temperature at which the thermal expansion coefficients of the substrate and the film come close to each other, and the temperature at which the sputtered material is not decomposed. The sputtering power contributes in direct proportionality to the thickness growth per unit time and is generally in the range of 1–5 KW, because when the incident ion energy is too great, the characteristics of the resulting film vary due to excessive rise in the surface temperature. The sputtering time is dependent on the desired thickness of the film.

Carbide resistor films have been heretofore formed by the sputtering technique as follows. When sintered SiC is used, for example, as a target material, the SiC thin resistor film is formed on a substrate of a selected temperature under such conditions as, for example, an rf power of 2 KW (frequency: 13.56 MHz), sputtering gas pressure on the order of $10^{-2}$ Torr., Ar sputtering gas (purity: 99.9999%), and sputtering time of 4–8 hrs. However the SiC resistor film obtained by such a method is disadvantageous in that its specific resistance or sheet resistance is great and that the specific resistance and the B constant are both scattered to an extent. Especially, the scattering in values of the specific resistance or sheet resistance and the B constant is a critical disadvantage in the manufacture of a thermistor using a SiC resistor film as a temperature sensitive resistor. In addition, in cases where conditions other than the sputtering time are held constant, the film thickness increases in proportion to the sputtering time but the sheet resistance is not necessarily inversely proportional to the thickness. Presumably, this is because the B constant varies depending on the sputtering time. This leads to a further disadvantage that where a SiC resistor film of a small sheet resistance value, particularly in a temperature range near room temperature is needed, the specific resistance gently decreases in relation to a film thickness, so that the sputtering time has to be made very long. The very long sputtering operation undesirably requires great amounts of materials, energy, and operation time and results in a high production cost.

Further, resistor films of carbides such as SiC have an additional disadvantage in that they are very high both in hardness and melting point, so that the film is hard to trim in a desired pattern in order to finely adjust its resistance value. That is, when the film is required to have an accurate resistance value, it is the usual practice to finely trim the electrode film or the resistor film in a desired manner by the sand blast trimming method or the laser trimming method to adjust its resistance to a predetermined level. In this connection, however, the former method is not applicable to a very hard film since such a film is not removed by fine particles of SiC, $Al_2O_3$ or the like which are blown from a nozzle under pressure. The latter method is not suitable for application to a high melting film such as SiC since the film is hardly evaporated by application of the laser beam.

SUMMARY OF THE INVENTION

It is an object of the present invention to provide a novel method for making a thin film thermistor using a carbide resistor film which is able to detect a wide range of temperatures.

It is another object of the invention to provide a method for making a thin film thermistor of low tolerance and high reliability.

It is a further object of the invention to provide a method for making a carbide thin film thermistor by a sputtering technique by which a carbide resistor film having excellent thermal stability can be made with high reproducibility and in which its resistance can be readily controlled over a wide range.

It is still a further object of the invention to provide a method for making a carbide thin film thermistor in which the carbide film and/or the electrode film can be suitably trimmed to finely adjust its resistance to a desired level.

It is another object of the invention to provide a method in which a carbide resistor film can be protected from severe environments contaminated by humidity, fine droplets of water, vapors of seasonings and the like, ensuring high reliability of operation even when placed under such severe conditions.

According to one aspect of the present invention, there is provided a method for making a carbide thin film thermistor which comprises providing an insulating substrate, forming at least one pair of electroconductive electrodes on the insulating susbstrate in a desired pattern, the electrodes being electrically insulated from each other, and forming a resistive carbide film on the insulating substrate and the electroconductive electrodes, while leaving part of each electrode exposed for external connections, by a sputtering technique in which a carbide target is sputtered in an inert gas atmosphere containing a small amount of an impurity gas.

The impurity gas is selected from $O_2$, $N_2$, CO, $CO_2$ air and a mixture thereof and the inert gas is, for example, Ar, Xe, Ne, Kr and the like gases. The content of the impurity gas depends on the type of the gas used, the mode of the sputtering and a desired level of resistance.

As is well known in the art, the sputtering technique can be broadly classified into two categories, including ordinary or non-reactive sputtering and reactive sputtering. In the former category, an inert gas is used as the atmospheric gas so that the sputtering atmosphere is made inactive, and a film formed under such conditions has almost the same composition as the target material used. On the other hand, the latter method utilizes a reaction of the target material with a reactive gas contained in an inert gas sputtering atmosphere. The resulting film obtained by this method generally contains an oxide or a nitride and is usually an electrical insulator or a similar material. In the reactive sputtering method, the active gas is usually contained in the range of above 50% or more.

Though the method of the present invention includes within its scope both modes of sputtering mentioned above as will be discussed in detail hereinafter, the amount of impurity gas is much smaller in both modes of sputtering of the invention than the used in the known reactive sputtering techniques.

In the ordinary mode of the sputtering, impurity gases are added to, in practice of the invention, an inert gas in amounts which follow: $N_2$ gas is below 2.5 vol%; CO or $CO_2$ gas is below 1.5 vol%; $O_2$ gas is below 0.6 vol%; air is below 2.0 vol%; and a gas mixture composed, for example, of 78.5 vol%, of $N_2$, 21.45 vol% of $O_2$ and 0.05 vol% of $CO_2$ is below 2.0 vol%, provided that the amount of the gas mixture varies depending on the gas composition. In a preferred aspect, $N_2$ gas is in the range of about 0.05 to 2.5 vol%, CO or $CO_2$ gas is in the range of about 0.1 to 1.5 vol%, $O_2$ gas is in the range of about 0.1 to 0.6 vol%, air is in the range of about 0.05 to 2.0 vol% and the gas mixture is in the range of about 0.05 to 2.0 vol%.

This mode of sputtering is characterized in that the resistance value of a formed carbide resistor film decreases with an increase of the amount of the impurity gas within the above-defined ranges.

On the other hand, when the sputtering is conducted in the reactive mode, impurity gases of the same type as mentioned above are used in such amounts that the specific resistance of the carbide film is below $10^5 \Omega$-cm. In order to attain such a specific resistance, the impurity gases are added as follows: $N_2$ gas is in the range of 2.5 to 10 vol%, CO gas is in the range of about 1.5 to 7.0 vol%, $CO_2$ gas is in the range of about 1.5 to 5.0 vol%, $O_2$ gas is in the range of 0.6 to 7.0 vol%, and air or the mixture gas is in the range of 2.0 to 9.0 vol%. That is, the resistance curve of a carbide resistor film which has been formed in an atmosphere containing a small amount of an impurity gas has an inflection point inherent to the impurity gas used. For instance, with $N_2$ gas, the resistance decreases with an increase of the content of $N_2$ gas until it reaches 2.5 vol% and then sharply increases with an increase of the gas content as will be particularly discussed hereinafter.

According to another aspect of the invention, the carbide resistor film which is very high in hardness and melting point can be trimmed by means of a diamond tool with a specific shape of edge so as to suitably adjust the resistance of the film. The diamond tool is usually shaped in the form a cylinder or a wedge at its edge.

According to a further aspect of the invention, the thermistor element is connected with lead wires at the exposed portions of the electrodes. The lead wire includes a fine metal wire connected to the exposed electrode portion at one end thereof and a Kovar wire connected to the other end of the metal wire. The thermistor element having the lead wires connected thereto is placed in a glass tube and is then hermetically sealed within the tube. Preferably, the connection between the fine metal wire and the exposed electrode portions is reinforced by applying a glass powder of low melting point thereto and fusing or sintering it. By the arrangement as described above, the thermistor element can be satisfactorily protected from environments.

PREFERRED EMBODIMENTS OF THE INVENTION

Figure 1:
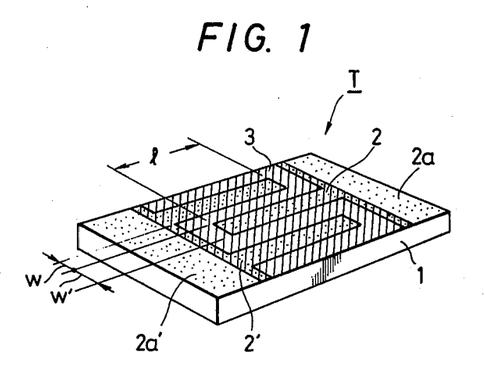
FIG. 1 is a schematic view of a thermistor element according to the invention.

Referring now to FIG. 1, there is shown a thermistor element generally indicated at T. The thermistor element T includes an insulating substrate 1, on which are formed electrode films 2,2' and a carbide resistor film 3 in this order in such a way that portions 2a, 2'a of the electrode films 2,2' are exposed for external connections. The electrode films 2,2' are formed in such a pattern as shown in FIG. 1. The resistance of the element depends on the specific resistance and thickness of the carbide resistor film 3 and the pattern form of the electrode films 2,2'. When the electrode films 2,2' are so formed as to have an effective length l and a width ω between the adjacent two electrodes as shown in the figure, the ratio ω/l contributes almost directly proportionally to the resistance but the number of electrode pairs contributes almost inversely proportionally to the resistance.

One of the important features of the invention resides in a novel method for forming the carbide resistor film by a sputtering technique and this method will be particularly described by the following experimental example.

In the first step of making the termistor element T of FIG. 1, there is provided an insulating substrate 1 such as, for example, an alumina substrate (purity: 96% and thickness: 0.65 mm). Needless to say, any insulating material other than alumina may be used in the practice of the invention. Then, a conductive paste such as of Ag, Au, Ag-Pd or Au-Pt is applied to the substrate to form an electroconductive thick film of such a pattern as shown in FIG. 1. In this experiment, the pattern is designed to have an effective length l of 2.0 mm and a width ω between adjacent two electrodes of 0.3 mm or an effective length l of 3.0 mm and a width ω of 0.45 mm, both having a ratio ω/l of 0.15. Accordingly, when the carbide resistor film 3 is held constant with respect to its specific resistance and thickness, the thermistor elements using the above-mentioned patterns show substantially the same resistance value, so that either of the patterns may be used without involving any difficulty when used to investigate the method of forming the carbide resistor film 3.

Then, the carbide resistor film is formed on the substrate in a desired manner by a sputtering technique using, for example, a planar rf-sputtering apparatus having a sputtering chamber with a dimension of 350 mm×250 mm in height and SiC as a carbide target material. The sputtering conditions in this experiment are as follows:

rf power: 2 KW
Inert gas: Ar (purity 99.9999%)
Sputtering pressure: about $10^{-2}$ Torr.

In practice, the sputtering is conducted as follows. The sputtering vacuum chamber is evacuated to a vacuum of the order of $10^{-6}$ Torr., into which is charged a predetermined amount of an impurity gas such as $O_2$, $N_2$, CO, $CO_2$ or a mixture thereof including air, and is then charged with an inactive gas to a vacuum of about $10^{-4}$ Torr. At that time, the main valve of the vacuum evacuation system is fully opened and then partially opened so that the vacuum is controlled to be at about $10^{-2}$ Torr. Then, the rf power is applied for sputtering of the SiC target. It will be noted that the purity of Ar gas used is 99.9999%, that of $O_2$ or $N_2$ is 99.999%, and that of CO of $CO_2$ is 99.99%. The mixed gas used in a mixture of the above-indicated gases of such purities as indicated above. The SiC resistor films obtained by the above-described method are used to determine their resistance and specific resistance, with the results shown in Tables I-V. The resistance is measured in a thermostatic oil bath at 50° C. Table I shows the results of a resistance in relation to a variation in content of air or oxygen where silicon carbide or boron carbide is used as the target material and the film is formed to a thickness of 7 μm and the substrate temperature is 700° C. Similarly, the results of Tables II-V for different impurity gases are obtained using a substrate temperature of 650° C. and a carbide film thickness of 2 μm. In these tables, the term "Ar alone" indicated at I and II means no impurity gas is added, and such sputtering is thus the known sputtering method. Aside from Ar, other inactive gases such as Xe, Ne, Kr and the like are usable and the results using such gases are also shown in the tables. In addition, $B_4C$ can be likewise used as a target material and the results using $B_4C$ are also shown.

TABLE I

| Sample No. | Amount of Impurity Gas (vol %) | Resistance (kΩ) | Specific Resistance (Ω-cm) |
|---|---|---|---|
| SiC Target Material | | | |
| I | Ar alone | 1280.0 | 11900 |
| 1 | air/Ar 0.02 | 220.0 | 2000 |
| 2 | air/Ar 0.10 | 140.0 | 1300 |
| 3 | air/Ar 0.20 | 40.0 | 370 |
| 4 | air/Ar 0.60 | 7.0 | 65 |
| 5 | $O_2$/Ar 0.60 | 11.0 | 100 |
| 6 | air/Xe 0.60 | 4.0 | 37 |
| $B_4C$ Target Material | | | |
| II | Ar alone | 1.5 | — |
| 7 | air/Ar 0.60 | $2.0 \times 10^{-2}$ | — |
| 8 | $O_2$/Ar 0.60 | $8.2 \times 10^{-2}$ | — |
| 9 | air/Xe 0.60 | $1.3 \times 10^{-2}$ | — |

TABLE II

| Sample No. | Amount of Impurity Gas (vol %) | Resistance (kΩ) | Specific Resistance (Ω-cm) |
|---|---|---|---|
| SiC Target Material | | | |
| I | Ar alone | 1200.0 | 3200 |
| 1 | $N_2$/Ar 0.05 | 839.0 | 2237 |
| 2 | $N_2$/Ar 0.10 | 348.0 | 928 |
| 3 | $N_2$/Ar 0.20 | 96.0 | 256 |
| 4 | $N_2$/Ar 0.30 | 43.1 | 115 |
| 5 | $N_2$/Ar 0.60 | 11.3 | 30 |
| 6 | $N_2$/Ar 0.90 | 5.1 | 14 |
| 7 | $N_2$/Ar 1.20 | 3.0 | 8 |
| 8 | $N_2$/Ar 2.50 | 1.2 | 3 |
| 9 | $N_2$/Xe 0.60 | 6.7 | 18 |
| 10 | $N_2$/Ne 0.60 | 17.0 | 45 |

TABLE II-continued

| Sample No. | Amount of Impurity Gas (vol %) | | Resistance (kΩ) | Specific Resistance (Ω-cm) |
|---|---|---|---|---|
| 11 | $N_2$/Kr | 0.60 | 7.9 | 21 |
| $B_4C$ Target Material | | | | |
| II | Ar alone | | 1.4 | — |
| 12 | $N_2$/Ar | 0.60 | 1.3 | — |
| 13 | $N_2$/Xe | 0.60 | 1.1 | — |
| 14 | $N_2$/Ne | 0.60 | 2.4 | — |
| 15 | $N_2$/Kr | 0.60 | 1.1 | — |

TABLE III

| Sample No. | Amount of Impurity Gas (vol %) | | Resistance (kΩ) | Specific Resistance (Ω-cm) |
|---|---|---|---|---|
| SiC Target Material | | | | |
| I | Ar alone | | 1200 | 3200 |
| 1 | $CO_2$/Ar | 0.05 | 1005 | 2680 |
| 2 | $CO_2$/Ar | 0.10 | 980 | 2613 |
| 3 | $CO_2$/Ar | 0.20 | 633 | 1688 |
| 4 | $CO_2$/Ar | 0.30 | 509 | 1357 |
| 5 | $CO_2$/Ar | 0.40 | 457 | 1219 |
| 6 | $CO_2$/Ar | 0.60 | 418 | 1115 |
| 7 | $CO_2$/Ar | 0.80 | 406 | 1083 |
| 8 | $CO_2$/Ar | 1.00 | 404 | 1077 |
| 9 | $CO_2$/Ar | 1.50 | 401 | 1069 |
| 10 | $CO_2$/Xe | 0.60 | 254 | 677 |
| 11 | $CO_2$/Ne | 0.60 | 643 | 1715 |
| 12 | $CO_2$/Kr | 0.60 | 300 | 800 |
| $B_4C$ Target Material | | | | |
| II | Ar alone | | 1.4 | — |
| 13 | $CO_2$/Ar | 0.60 | 1.1 | — |
| 14 | $CO_2$/Xe | 0.60 | $7.5 \times 10^{-1}$ | — |
| 15 | $CO_2$/Ne | 0.60 | 1.7 | — |
| 16 | $CO_2$/Kr | 0.60 | $9.5 \times 10^{-1}$ | — |

TABLE IV

| Sample No. | Amount of Impurity Gas (vol %) | | Resistance (kΩ) | Specific Resistance (Ω-cm) |
|---|---|---|---|---|
| SiC Target Material | | | | |
| I | Ar alone | | 1200 | 3200 |
| 1 | CO/Ar | 0.05 | 1040 | 2773 |
| 2 | CO/Ar | 0.10 | 1017 | 2712 |
| 3 | CO/Ar | 0.20 | 656 | 1749 |
| 4 | CO/Ar | 0.40 | 475 | 1267 |
| 5 | CO/Ar | 0.60 | 433 | 1155 |
| 6 | CO/Ar | 0.80 | 421 | 1123 |
| 7 | CO/Ar | 1.00 | 419 | 1117 |
| 8 | CO/Ar | 1.50 | 416 | 1109 |
| 9 | Co/Xe | 0.60 | 281 | 749 |
| 10 | Co/Ne | 0.60 | 646 | 1723 |
| 11 | Co/Kr | 0.60 | 317 | 845 |
| $B_4C$ Target Material | | | | |
| II | Ar alone | | 1.4 | — |
| 12 | Co/Ar | 0.60 | $5.1 \times 10^{-1}$ | — |
| 13 | Co/Xe | 0.60 | $3.3 \times 10^{-1}$ | — |
| 14 | Co/Ne | 0.60 | $7.5 \times 10^{-1}$ | — |
| 15 | Co/Kr | 0.60 | $4.2 \times 10^{-1}$ | — |

TABLE V

| Sample No. | Amount of Impurity Gas (vol %) | | Resistance (kΩ) | Specific Resistance (Ω-cm) |
|---|---|---|---|---|
| SiC Target Material | | | | |
| I | Ar alone | | 1200.0 | 3200 |
| 1 | mixed gas*/Ar | 0.05 | 567.0 | 1512 |
| 2 | mixed gas*/Ar | 0.10 | 266.0 | 709 |
| 3 | mixed gas*/Ar | 0.50 | 20.6 | 55 |
| 4 | mixed gas*/Ar | 0.80 | 8.8 | 24 |
| 5 | mixed gas*/Ar | 1.00 | 5.9 | 16 |
| 6 | mixed gas*/Ar | 2.00 | 1.7 | 4.5 |
| 7 | mixed gas/Xe | 0.50 | 20.4 | 54 |
| 8 | mixed gas/Ne | 0.50 | 46.9 | 125 |
| 9 | mixed gas/Kr | 0.50 | 22.7 | 61 |
| $B_4C$ Target Material | | | | |
| II | Ar alone | | 1.4 | — |
| 10 | mixed gas/Ar | 0.50 | $2.3 \times 10^{-1}$ | — |
| 11 | mixed gas/Xe | 0.50 | $1.4 \times 10^{-1}$ | — |
| 12 | mixed gas/Ne | 0.50 | $3.2 \times 10^{-1}$ | — |
| 13 | mixed gas/Kr | 0.50 | $1.8 \times 10^{-1}$ | — |

*Mixed gas composed of 78.50 vol % of $N_2$, 21.45 vol % of $O_2$ and 0.05 vol % of $CO_2$.

As will be apparent from the results shown in the tables, when the amounts of impurity gases are increased, the resistance of the carbide resistor films decreases. In this connection, however, if the amount of the impurity gas is further increased, the resistance of the carbide resistor film which has been at a minimum, sharply increases, as will be discussed hereinafter.

A number of the carbide resistor films thus obtained, including a sample which has been obtained under conditions where no impurity gas is added, as well as sample Nos. 1, 8, 9, 10, 11, 12, 13, 14 and 15 of Table II were subjected to X-ray diffraction, reflection electron diffraction and infrared absorption analyses to determine their structure. As a result, it was found that all the samples showed an intense absorption peak characteristic of $\beta$-SiC at $2\theta = 35.6°$ when analyzed by X-ray diffraction, and that diffraction rings characteristic of $\beta$-SiC were observed in the case of the reflection electron diffraction. Further, the infrared absorption analysis for the SiC resistor films revealed that a strong absorption edge at about 790 $cm^{-1}$ characteristic of the SiC bonds was observed. In addition, it was confirmed that the $B_4C$ resistor film had a rhombohedral structure.

From the above, it will be understood that the carbide resistor films obtained by the above-described method are completely different from those obtained by the so-called reactive sputtering method. In the reactive sputtering method, the sputtering is conducted in an atmosphere to which an impurity gas such as $O_2$ or $N_2$ is added similarly to the case of the invention, but in large amounts. Accordingly, a resistor film obtained by reactive sputtering method is made of an oxide or a nitride of a target material, e.g. when Si is used as a target material, a $SiO_2$ film or a $Si_3N_4$ film is formed as the resistor film. In other words, the reactive sputtering method forms a film of a reaction product between the target material and the impurity gas. In this mode of the method of the invention, the impurity gases are used in such a small amount that, as will be seen from the analytical results, the presence of neither oxide nor nitride was observed. In this sense, the sputtering procedure as described above is clearly different from the known reactive sputtering method. When the sputtering is conducted in an atmosphere containing an impurity gas within a range of amounts where a target material undergoes little or no reaction with the impurity gas and thus the carbide resistor film obtained has almost the same composition as a target carbide material, the carbide resistor film can be arbitrarily controlled to have a desired level of resistance by controlling the amount of added impurity gas, and the resistance of the film decreases with an increase of the amount of the impurity gas within a certain range.

With $N_2$ gas, when its amount is controlled to be in a range of below 2.5 vol% and SiC is used as a target material, the specific resistance of the resulting SiC resistor film can be arbitrarily controlled to be in the range of 3–3000 $\Omega$-cm. Likewise, with CO or $CO_2$ gas, the specific resistance of the SiC resistor film can be arbitrarily controlled to be in the range of about 1000–3000 $\Omega$-cm when the amount of the gas is in the range of below 1.5 vol%. The rate of reduction of the specific resistance by the addition of CO or $CO_2$ gas is smaller than that attained by addition of $N_2$ gas but the specific resistance shows a similar decreasing tendency. $O_2$ gas used as an impurity gas contributes to lowering the specific resistance of the resulting carbide resistor film intermediately between $N_2$ gas and CO or $CO_2$ gas. The specific resistance of a carbide resistor film can be arbitrarily controlled in the range of 100–3000 $\Omega$-cm when $O_2$ gas is used in an amount below 0.6 vol%. Likewise, when air or a mixed gas which is prepared to have a composition of 78.50 vol% of $N_2$, 21.45 vol% of $O_2$ and 0.05 vol% of $CO_2$ is used in an amount below 2 vol%, the specific resistance of the SiC resistor film can be arbitrarily controlled to be in the range of 4–3000 $\Omega$-cm depending on the amount of the impurity gas.

While very small amounts of the impurity gases, say, in the order of $10^{-2}$ or $10^{-3}$ vol%, may be usable in the practice of the invention, it is preferable that the amount be in the range of about 0.05 to 2.5 vol% in the case of $N_2$ gas, about 0.1 to 0.60 vol% in the case of $O_2$ gas, about 0.1 to 1.5 vol% in the case of CO or $CO_2$ gas, and about 0.05 to 2.0 vol% in the case of the mixed gas or air.

As will be understood from the above, the method of the invention can form a carbide resistor film which has almost the same composition as the carbide target material when the sputtering is conducted in an inert gas sputtering atmosphere to which a predetermined small amount of an impurity gas such as $N_2$, $CO_2$, CO, $O_2$, air or a mixture thereof is added. Such a carbide resistor film has a much smaller specific resistance than a resistor film obtained by sputtering in an atmosphere of inert gas alone. This means that a thermistor element of the same level of resistance can be made in a smaller size as compared with that obtained by the latter method. According to the method of the invention, the sputtering time can be reduced and the control of resistance is easy since it is sufficient to merely control the amount of the impurity gas in the atmosphere. By reducing the time, comsumption of materials and personnel expenses can be also reduced, leading to a lowering of production costs of the thermistor.

All the samples shown in the foregoing tables were then subjected to a life test where they were allowed to stand at 350° C. for 1000 hours and also to a heat shock test of 3000 cycles, each cycle being conducted such that samples were held at room temperature for 15 minutes and then at 350° C. for 15 minutes. As a result, it was found that rates of variation in resistance were within ±6% in all cases. As a matter of course, the carbide resistor films obtained by the known method where no impurity gas is added showed similar results. From this it will be understood that the impurity gases have no influence on the thermal stability of carbide resistor films and thus the carbide resistor films obtained according to the method of the invention have an excellent thermal stability similar to the known films obtained by the ordinary sputtering method.

Figure 2:
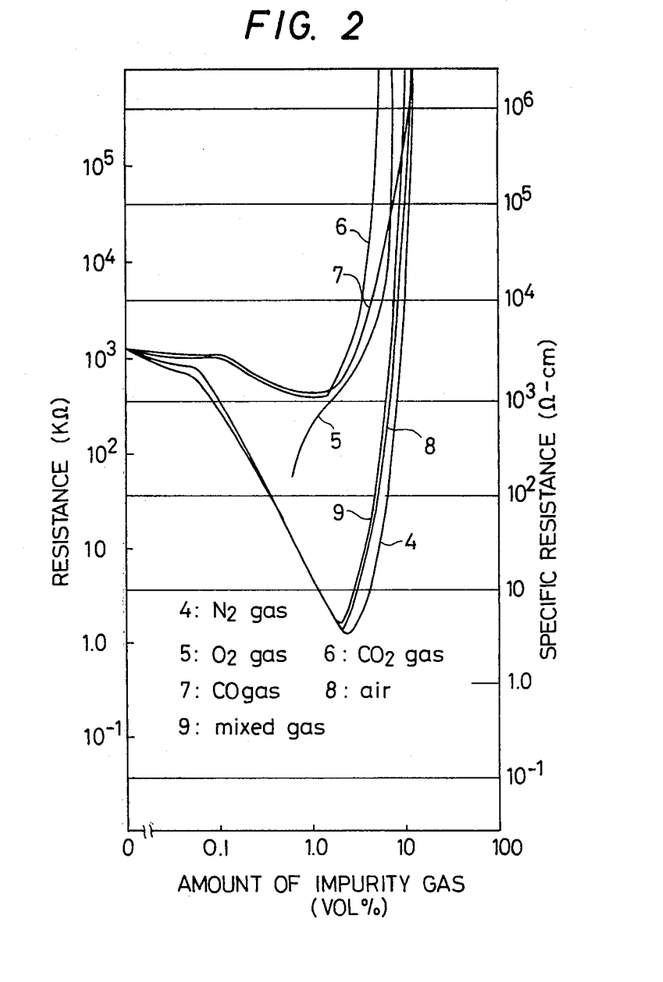
FIG. 2 is a graphical representation of resistance in relation to a variation in concentration of an impurity gas in a sputtering gas atmosphere for different types of impurity gases.

Relationships between resistances or resistivities of SiC resistor films and amounts of the respective impurity gases are shown in FIG. 2, in which the amounts of the impurity gases extend from zero to over the amounts shown in Tables I through V, respectively. The SiC resistor films are made under the same conditions as described hereinbefore except that the substrate temperature is 650° C. and the SiC film thickness is 2 $\mu$m. In the figure, curves 4, 5, 6, 7, 8, and 9 are, respectively, for $N_2$ gas, $O_2$ gas, $CO_2$ gas, CO gas, air and a mixed gas having the same composition as indicated before. It will be noted that the curves 5 and 8 are cut off in the low range of amounts of the impurity gases since $O_2$ gas and air are used to conduct a sputtering method using a substrate temperature of 700° C. However, later investigations made by use revealed that the curve 8 was almost similar to the curve 9 in the lower range and that the curve 5 showed a tendency to asymmetrically approach the curve 9. The thermistor element used was of the same type as shown in FIG. 1.

As is clearly seen from FIG. 2, when the amounts of the impurity gases reach certain levels, the resistance values or resistivities which have been at a minimum sharply increase with an increase of the amount of impurity gas. When the amount of an impurity gas was further increased, for example, up to above 50 vol%, the resulting film had a composition close to an oxide or a nitride and exhibited electrical properties similar to dielectric or insulating materials, showing a very high resistance value. This sputtering procedure where the amount of an impurity gas is above 50 vol% belongs apparently to a reactive sputtering method. From this, it is believed that in the higher range of amounts of impurity gases shown in FIG. 2, i.e. in the range where the resistance or specific resistance of a resistor film increases, the formed film is affected by reaction with an impurity gas and thus its specific resistance increases. In this connection, however, the resistor film formed according to the invention is predominantly composed of a carbide and may thus be regarded as a carbide. Accordingly, the resistance of the carbide resistor film can be arbitrarily controlled over a wide range by the sputtering technique where the resistance or specific resistance of the carbide film increases with an increase of the amount of an impurity gas similarly to the case of the ordinary reactive sputtering method. In this case, SiC is most suitable as a carbide target material. This is because when a carbide resistor or target material such as B or Zr (other than SiC) was used to make a similar investigation, it was found that part of the resulting resistor film was peeled off when subjected to a heat shock test. Preferably, amounts of the impurity gases are determined as follows: The lower limit is the minimum amount from which the specific resistance of the formed film starts to increase; and the upper limit is the amount at which the formed film has a specific resistance of $10^5$ $\Omega$-cm. The lower limit is the minimum amount from which the reactive sputtering starts to occur (i.e. since the specific resistance is at a minimum at the minimum amount, the reactive sputtering is believed to occur at the minimum amount). A possible reason why the upper limit is so determined that a formed film has a specific resistance of $10^5$ $\Omega$-cm is that a practically usable resistance is ensured by suitably dressing an electrode if the specific resistance is below $10^5$ Ω-cm. That is, though the electrode arrangement of FIG. 1 has an ω/l ratio of 0.15, such ratio can be reduced to as small as about $10^{-3}$ by finely trimming the electrode construction by a photoetching or electron beam lighographic technique. Use of such an electrode construction can obtain a thermistor element of 500KΩ even when using a SiC resistor film having, for example, a specific resistance of $10^5$ Ω-cm and a thickness of 2 μm.

In order to obtain the specific resistance of a resistor film in the range defined above, the impurity gases are used in amounts which follow: From 2.5 to 10.0 vol% for $N_2$ gas; from 1.5 to 7.0 vol% for CO gas; from 1.5 to 5.0 vol% for $CO_2$ gas; from 0.6 to 7.0 vol% for $O_2$ gas; and from 2.0 to 9.0 vol% for air or the mixed gas.

The thus formed SiC resistor films show an excellent thermal stability similar to a SiC resistor film formed by a known method when determined by the high temperature life test and the heat shock test described hereinbefore.

As will be appreciated from the above description, the carbide resistor films obtained according to the other mode of the sputtering method of the invention can also be stably controlled to have a resistance value over a wide range.

However, with the carbide resistor film obtained by the invention, the resistance tolerance is generally within a range of 10–30%. Higher tolerances are not practical since yields are lowered to an extent. Accordingly, another aspect of the present invention resides in that the electrode films 2,2' and the carbide resistor film 3 of the thermistor element T of FIG. 1 are trimmed to finely adjust the resistance of the element. As described hereinbefore, the carbide resistor film is high in hardness and melting point and thus it is difficult to trim it by ordinary trimming methods including, for example, sand blasting, laser trimming method and the like.

We have found that when a diamond edge of a cylindrical or wedge form is used to cut the electrode films 2, 2' and the carbide resistor film 3 in a desired pattern, the resistance can be precisely, easily trimmed.

Figure 3:
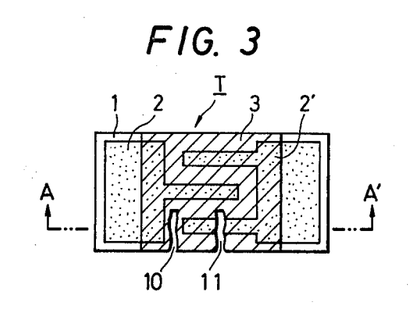
FIG. 3 is a schematic plan view of a thermistor element which has been trimmed.
Figure 4:
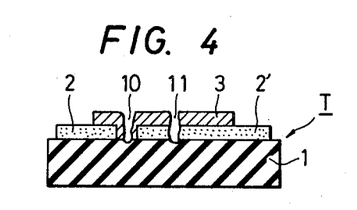
FIG. 4 is a sectional view taken along the line A-A' of FIG. 3.

One embodiment of a trimmed thermistor element according to the present invention is shown in FIGS. 3 and 4. As shown in these figures, a part 10 of the carbide resistor film 3 and/or a part 11 of the electrode 2 or 2' along with the film 3 is cut to a depth of the substrate 1, by which the thermistor element T can be adjusted to have a desired level of resistance.

Figure 5:
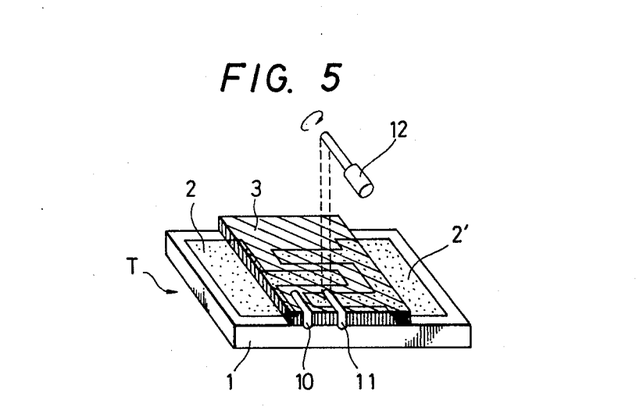
FIG. 5 is a schematical view illustrating the manner of the trimming.

The manner of trimming the element is schematically shown in FIG. 5. As shown in the figure, a diamond edge 12 of a cylindrical form is provided and is then rotated by a suitable means. The rotating diamond edge 12 is pressed against the thermistor element T at a predetermined portion to locally cut off the carbide resistor film 3 or both the carbide resistor 3 and the electrode film 2 or 2' included in the portion in the form of a groove 10 or 11 to dress the carbide resistor and/or electrode. The size of the edge 12 is suitably selected within a range of 0.1–1.0 mm in consideration of the electrode width w' and the resistor film width w shown in FIG. 1. The diamond edge 12, which is being rotated, is pressed against the desired portion of the thermistor element T such that the axis of the edge 12 is parallel to the plane of the resistor film 3. Use of the diamond edge 12 has the advantage that not only a thin film of such a hard and high melting point material as SiC can be easily cut off, but also a fine trimming can be easily made since the small-size edge of 0.1–1.0 mm used.

Further, use of the diamond edge of a small-size cylinder ensures very rapid cooling of the edge which has been frictionally heated during operation. For instance, when a diamond edge of a 0.5 mm cylinder is used to cut off a SiC film formed on an alumina substrate 0.2–0.5 mm in width and 0.7–0.3 mm in length, it was found sufficient for the cooling to apply a water or silicone oil droplet of 2–4 mm in diameter to the position to be cut. Since the edge is very easily cooled and a very small amount of quenching solution is sufficient, the trimming is readily while operating under a microscope, a precise stage of which is able to precisely position the element in all directions X, Y and Z. Accordingly, the trimmed position can be accurately determined without impeding the operation efficiency. This trimming procedure is very advantageous over the known one using a cooling system in which a large amount of a cooling or quenching solution is continuously applied to a position to be cut since use of the solution in large amounts results in corrosion of the stage or the microscope and also in contamination of the lenses of the microscope.

The diamond edge is generally rotated at revolution speeds ranging 100–1,000 r.p.m.

Instead of using the diamond edge of a small-size cylinder, a diamond edge of a wedge form may be used, in which case ultrasonic vibrations are applied to the edge, with similar results being attained. That is, similar cutting results are obtained even though either a mechanical rotation energy or a vibration energy is used. The wedge of the diamond edge should preferably have a terminal angle of 30°–150° and a length of 0.1–1 mm.

By the trimming method of the invention, the accuracy of the resistance can be enhanced to a level of ±2–6%.

In the above illustration, the axis of the diamond edge 12 and the plane of the resistor film 3 are arranged parallel to each other. This is convenient for trimming the peripheral portion of the element to be cut as shown. However, if it is desired to trim or remove only a central portion of the thermistor element, the tip of the diamond edge 12 may be, of course, brought into contact with the surface of the resistor film 3 so that they are at an angle.

In order to practically use the thermistor element, it is necessary to protect the element from dust, moisture, organic gases and the like environments.

A further aspect of the invention resides in such a protecting arrangement.

Figure 6:
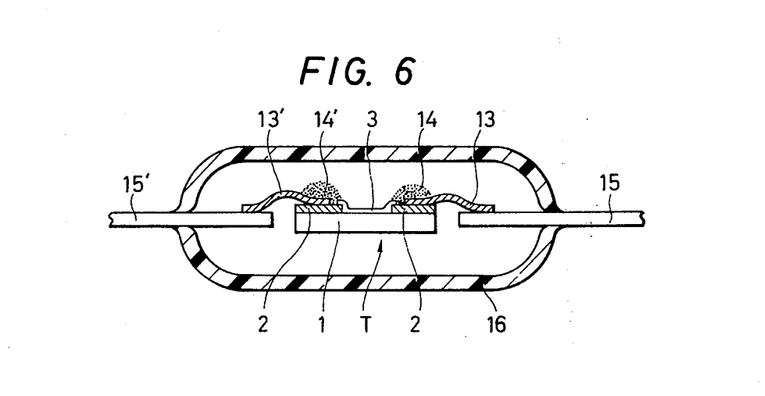
FIG. 6 is a schematic cross-sectional view of a thermistor in which a thermistor element is enclosed in a glass tube.

The protecting arrangement suitable for the thermistor element according to the invention is shown in in FIG. 6. The thermistor element T is electrically connected at the exposed portions of the electrodes 2,2' to a pair of fine metal wires 13, 13' serving as internal lead wires each at one end thereof, for example, by welding. Preferably, the connections are reinforced by sintering a low melting glass powder, as at 14, 14'. The internal lead wires 13, 13' are then connected, such as by welding, to Kovar wires 15, 15' used as external lead wires. Then, the thermistor element T is placed in a glass tube 16 of borosilicate glass having openings at both ends thereof so that the Kovar wires 15, 15' extend outwardly from the openings at the other end thereof, respectively. Then, the glass tube is fused together at the both ends through the Kovar wires 15, 15'. By this arrangement, the thermistor element T is hermetically sealed in the glass tube and can thus be completely protected from harmful external environments such as moisture.

Examples of the fine metal wire 13 or 13' include Au wire, Al wire, Pt wire and the like. Of these, the Pt wire is preferable for reasons which follow. That is, the Au wire is generally soft in a mechanical sense and is susceptible to deformation at a portion where welded, and the Au wire itself is disadvantageously lowered in mechanical strength. The Al wire has a melting point of about 660° C. and is thus thermally poor. This may lead to a disadvantage that when the welded portion of the fine metal wire 13 or 13' and the electrode film 2 or 2' is reinforced by a sintered glass of low melting point, the Al wire cannot easily withstand a high temperature, oxidative atmosphere, i.e. air. The Pt wire has great mechanical strength and shows a high strength of welding with the electrode film 2. That is, the welded portion is scarcely deformed and its tensile strength is about 5 g (while the tensile strength of the Au wire is 3 g). In addition, the Pt wire shows an excellent heat resistance in air.

The size of the Pt wire desirably in the range of 0.1–0.2 mm. This is because in order to prevent resonance of the thermistor element in the inside of the glass tube 16 when mechanical shocks or impact are applied to the protecting arrangement of FIG. 6, the fine metal wire 13 is desirably as mechanically hard as possible and simultaneously the weldability of the wire must be taken into account. In other words, the former requires a Pt wire which is as large in diameter as possible, but the latter requires that the Pt wire be rather small in diameter since when the Pt wire is large in diameter, the welding becomes difficult due to a great difference in heat capacity between the Pt wire and the electrode film.

The Pt wire has a further advantage that it is superior in adhesion to the sintered glass over the other wires.

The tensile strength of the Pt wire and the electrode film at the welded portion is about 5 g and rather poor. When the welded portion is covered with a sintered mass of a low melting glass, the tensile strength can be improved to a level of above 400 g. The covered, welded portion shows no problem even when subjected to a vibration test (maximum gravity: 5 G) in three directions of X, Y and Z each for 3 hours and can satisfactorily withstand practical use.

In order to prevent the bonded portions of the Kovar wires 15,15' and the glass tube 16 from being cracked when the protecting tube is subjected to the heat shock test described hereinbefore, the thermal expansion coefficients of the Kovar wire and the glass tube are preferably $55 \pm 5 \times 10^{-7}$/°C. in a temperature range of 0°–300° C. This is because similar thermal expansion characteristics contribute to thermally stabilize the bonded portion.

The thermistor element protected in such an arrangement shown in FIG. 6 was subjected to various tests including a vibration test, a heat shock test, a life test where it was allowed to stand at a high humidity over 95 R.H.% at 70° C., and a test where it was allowed to stand in an atmosphere containing organic vapors such as of oils, soys and the like, revealing that the rate of variation in resistance was below ±6%, and little or no change was observed with respect to thermal response, insulating resistance, insulating voltage and the like.

From the above it will be apparent that the protecting arrangement of FIG. 6 is effective in protecting the thermistor element from ill-conditioned environments.

What is claimed is:

1. A method for making a carbide thin film thermistor comprising:
   providing an insulating substrate;
   forming at least one pair of electroconductive electrodes on said insulating substrate in a desired pattern, the electrodes being electrically insulated from each other; and
   forming a resistive carbide film on said insulating substrate and said at least one pair of electroconductive electrodes, while leaving part of the electrodes exposed for external connections, by a sputtering technique in which a carbide target material selected from the group consisting of SiC and $B_4C$ is sputtered in an inert gas atmosphere containing an impurity gas selected from the group consisting of $O_2$, $N_2$, CO, $CO_2$, air and a mixture thereof.

2. A method according to claim 1, wherein said carbide target material is SiC.

3. A method according to claim 1, wherein said carbide target material is $B_4C$.

4. A method according to claim 1, wherein said impurity gas is $N_2$ gas and is used in an amount of below 2.5 vol% based on the total gas composition.

5. A method according to claim 1, wherein said impurity gas is CO or $CO_2$ and is used in an amount of below 1.5 vol% based on the total gas composition.

6. A method according to claim 1, wherein said impurity gas is $O_2$ and is used in an amount of below 0.6 vol% based on the total gas composition.

7. A method according to claim 1, wherein said impurity gas is air and is used in an amount of below 2.0 vol% based on the total gas composition.

8. A method according to claim 1, wherein said impurity gas is a mixed gas composed of 78.5 vol% of $N_2$ gas, 21.45 vol% of $O_2$ gas and 0.05 vol% of $CO_2$ gas and is used in an amount of below 2 vol% based on the total gas composition.

9. A method according to claim 1, wherein said carbide target material is SiC and said impurity gas which reacts with said target material on the sputtering is used in such an amount that the specific resistance of the resistor film is below $10^5$ Ω-cm and said impurity gas is selected from the group consisting of $N_2$, CO, $CO_2$, $O_2$ air and a mixture thereof.

10. A method according to claim 9, wherein said impurity gas is $N_2$ and is used in an amount of 2.5 vol% to 10.0 vol% based on the total gas composition.

11. A method according to claim 9, wherein said impurity gas is CO gas and is used in an amount of 1.5 vol% to 7.0 vol% based on the total gas composition.

12. A method according to claim 9, wherein said impurity gas is $CO_2$ gas and is used in an amount of 1.5 vol% to 5.0 vol% based on the total gas composition.

13. A method according to claim 9, wherein said impurity gas is $O_2$ gas and is used in an amount of 0.6 vol% to 7.0 vol% based on the total gas composition.

14. A method according to claim 9, wherein said impurity gas is air and is used in an amount of 2.0 vol% to 9.0 vol% based on the total gas composition.

15. A method according to claim 9, wherein said impurity gas is a mixed gas composed of 78.5 vol% of $N_2$ gas, 21.45 vol% of $O_2$ gas and 0.05 vol% of $CO_2$ gas and is used in an amount of 2.0 vol% to 9.0 vol% based on the total gas composition.

16. A method according to claim 1, further comprising removing said electrode film and/or said carbide film in a desired pattern by means of a diamond edge of a cylindrical or wedge form to adjust the resistance of said thermistor element to a desired level.

17. A method according to claim 16, wherein said diamond edge of cylindrical form has a diameter of 0.1–1.0 mm and is rotated.

18. A method according to claim 16, wherein said diamond edge of the wedge form has a terminal angle of 30°–150° and a length of 0.1–1 mm and is vibrated by ultrasonic frequency.

19. A method according to claim 1, further comprising connecting lead wires to said thermistor element at exposed portions of the electrodes, respectively.

20. A method according to claim 19, wherein said lead wires each consists of a fine metal wire and a Kovar alloy wire welded to each other at one end, and said metal wire is welded to the exposed portion at the other end.

21. A method according to claim 20, wherein said metal wire is a Pt wire of 0.1–0.2 mm in diameter.

22. A method according to claim 19, wherein the welded portion between each metal wire and each exposed portion of said electrode film is covered with a sintered mass of a low melting glass.

23. A method according to claim 19, further comprising placing the connected thermistor element in a glass tube so that the Kovar wires are each extending outwardly from the opening of said glass tube, and sealing up said thermistor element hermetically within said tube through said Kovar wires.

24. A method according to claim 23, wherein said glass tube is made of a borosilicate glass.

25. A method according to claim 24, wherein the thermal expansion coefficients of said Kovar wire and said glass tube are each in the range of from $50 \times 10^{-7}$ to $60 \times 10^{-7}$/°C. in the temperature range of from 30° to 300° C.

* * * * *